Aug. 25, 1959 J. R. SHERWOOD 2,901,614

COARSE FREQUENCY DISCRIMINATOR

Filed March 14, 1957

INVENTOR.
JOHN R. SHERWOOD

BY Marvin Moody

ATTORNEY

United States Patent Office 2,901,614

Patented Aug. 25, 1959

2,901,614

COARSE FREQUENCY DISCRIMINATOR

John R. Sherwood, Cedar Rapids, Iowa, assignor to Collins Radio Company, Cedar Rapids, Iowa, a corporation of Iowa Application March 14, 1957, Serial No. 645,957

1 Claim. (Cl. 250—40)

This invention pertains to automatic tuning in radio systems and more particularly to control circuits for controlling servo systems that are utilized for tuning.

The control circuits in the instant invention are applicable to servo systems that are used to tune a single stage or cascade stages in radio equipment. In order to tune over a wide frequency range, the control circuits described herein include a coarse-frequency discriminator in addition to a usual phase or fine-frequency discriminator. The control circuit responds to application of signal to the input of the tuned stages to develop a control voltage for operating an associated servo system. The operation of a control system that includes a coarse-frequency discriminator is described in an article "Automatic Tuning for High Power Transmitter" by V. R. DeLong published in the July, 1956, issue of Electronics magazine.

In certain control system in which fine-tuning discriminators are used, means have been included for initially operating tuning elements continuously throughout their tuning range in response to the application of a new frequency to the input of the system. When the tuning elements are positioned near resonance for the incoming signal, the fine-tuning discriminator gains control. Since the tuning elements are moved initially in a direction that is independent of the direction of frequency change, longer time than is necessary is often required to complete a tuning cycle. Furthermore, the fine-tuning discriminator fails to differentiate between the actual input frequency and a strong harmonic thereof and therefore may fail to develop voltage of proper polarity when the resonant circuits to be controlled are tuned to a harmonic. Through use of a coarse-frequency discriminator in conjunction with a fine-frequency discriminator, control voltage of proper polarity is always applied to the servo tuning system to move respective tuning elements directly to positions for obtaining resonance at the frequency of the incoming signal.

An object of the present invention is to provide in automatic tuning systems control circuits that respond only to fundamental input signals.

Another object is to provide in a servo tuning system a coarse-frequency discriminator that is easily constructed and that provides effective control voltage over a wide range of signal frequencies.

Another object is to provide a coarse-frequency discriminator that can be readily combined with a fine-frequency discriminator so that the combination provides required control voltage for directly tuning elements to an exact position for resonance.

Further objects will become apparent when the following description is read with reference to the accompanying drawings in which.

Figure 1:
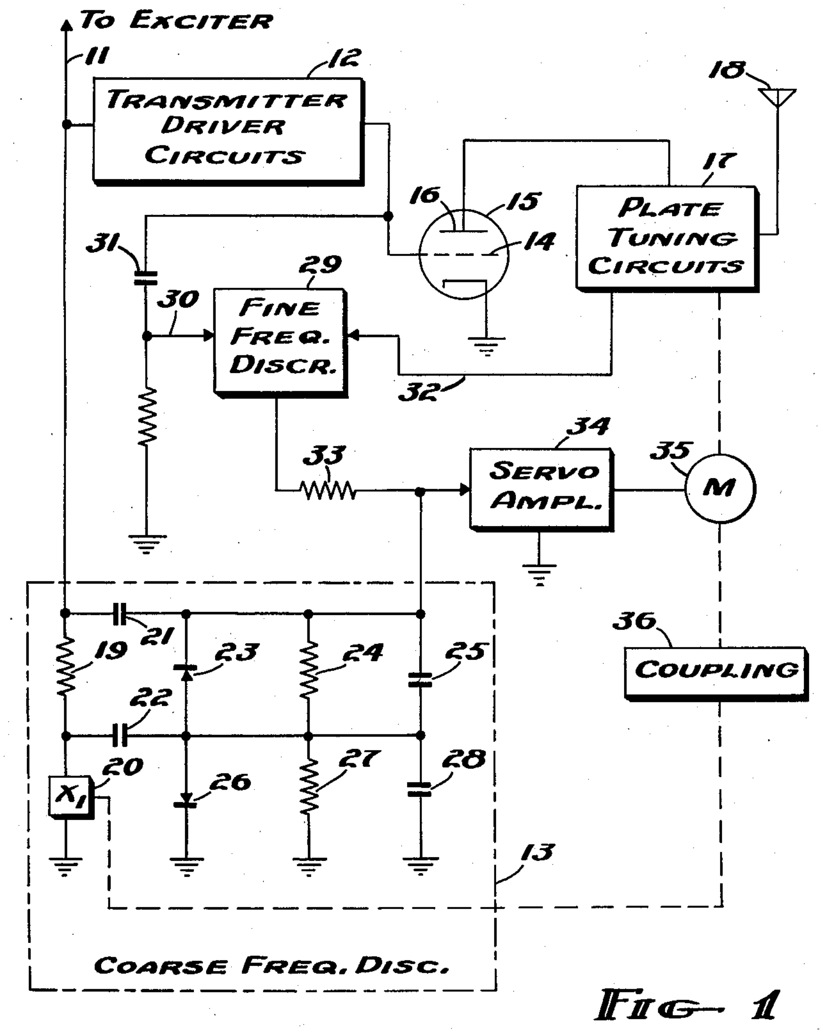
Figure 1 shows in block and schematic diagram form a coarse-frequency discriminator and associated radio transmitter circuits that are to be tuned.

When the frequency of signal that is applied to the input of the transmitter driver circuits of Figure 1 is changed for transmission on a different channel, the coarse-frequency discriminator develops substantial control voltage for operating a servo system that positions tuning elements in the plate circuit of a final stage of amplification. The coarse-frequency discriminator consists of means for comparing voltages across a resistor and an adjustable reactive element that are coupled to the input circuits of the driver circuits. This adjustable reactive element is mechanically coupled to the servo system that tunes the final stage of the transmitter. As the resonant frequency of the plate circuit approaches the frequency of the input signal, the amplitude of the control voltage derived from the coarse-frequency discriminator decreases while the amplitude of the control voltage derived from the fine-frequency discriminator increases. Finally, as the tuned elements are positioned exactly at the resonant frequency of the incoming signal, both control voltages become zero.

In detail, the automatically tuned transmitting circuit of Figure 1 includes input conductor 11 that connects a preceding exciter to transmitter driver circuits 12 and to coarse-frequency discriminator circuits 13. The output of the transmitter driver circuits is connected to control grid 14 of electron tube 15 in the final stage of the amplifier. The plate 16 of the tube is connected in a conventional manner to plate tuning circuits 17 that are coupled to an output load, for example, antenna 18.

The coarse-frequency discriminator which is coupled to the exciter includes resistor 19 connected in series with adjustable reactor 20. Reactor 20 is preferably a variable capacitor although it could also be a variable inductor. Resistor 19 is connected through coupling capacitors 21 and 22 in parallel with a conventional rectifier circuit that includes diode rectifier 23, load resistor 24, and filter capacitor 25. When an alternating-current voltage is applied across resistor 19, the rectifier circuit operates to apply across capacitor 25 a direct-current voltage that varies directly with the amplitude of the applied voltage. Reactor 20 is connected in parallel with diode rectifier 26, load resistor 27, and filter capacitor 28 through coupling capacitor 22 and a common ground connection. Obviously, the alternating-current voltage appearing across reactor 20 develops a direct-current voltage across capacitor 28. The diodes 23 and 26 have opposite polarities with respect to ground so that the voltages developed across series connected filter capacitors 25 and 28 also have opposite polarities. When the reactance of reactor 20 for a particular frequency of input signal is equal to the resistance of resistor 20, equal opposing voltages will appear across capacitors 25 and 28 so that the total voltage across the series capacitors will be equal to zero. The series connected capacitors 25 and 28 are connected to the input circuit of servo amplifier 34.

A fine-frequency discriminator 29 has an input circuit 30 coupled through capacitor 31 to control grid 14 of the final amplifier stage and an input circuit 32 coupled to plate tuning circuits 17. Fine-frequency discriminator 29 may be any of the well-known types that develop a direct-current voltage that is proportional to the phase difference between two input signals. The output of the fine-frequency discriminator is connected through resistor 33 to servo amplifier 34.

Servo amplifier 34 may include a chopper for converting direct-current voltage to alternating-current voltage having a suitable frequency for operating servo motor 35. The chopper may be followed by conventional alternating-current amplifier circuits for supplying sufficient operating power to the servo motor. Motor 35 is coupled through usual mechanical tuning arrangements to plate tuning circuit 17 and through coupling 36 to reactance element 20. Reactance element 20 must track with plate tuning circuit 17 in such a way that when the plate tuning circuits are resonant to the incoming frequency the reactance of element 20 will be equal to the resistance of resistor 19. Reactance 20 may be mechanically coupled directly to the plate tuning circuits providing it is constructed to have required variable impedance characteristics. For example, the plates of a variable capacitor may be formed so that impedance of the capacitor will be equal to the resistance of resistor 19 for all positions of the plate tuning circuits when tuned to resonance. However, if desired, reactance 20 may be of conventional type and coupling 36 may be non-linear to provide proper tracking. For example, a mechanical coupling that includes a special cam having a required contour surface may be used. Rather than using a special coupling, linear coupling may be used providing switching means that is mechanically coupled to the servo motor is incorporated to alter the value of resistor 19 at intervals during the tuning cycle.

Figure 2:
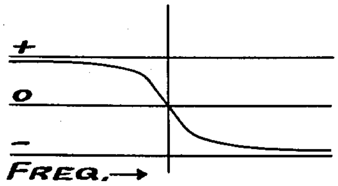
Figure 2 shows an error-voltage versus frequency curve of a coarse-frequency discriminator.

In considering the operation of the circuit of Figure 1, assume that reactive element 20 is a variable capacitor and that the tuning of the excitor that precedes transmitter driver circuits 12 has been changed to a signal of higher frequency. When the newly selected signal is applied to the input circuits of coarse-frequency discriminator 13, the voltage appearing across the resistor 19 will be greater than the voltage appearing reactive element 20. Further, if it is assumed that diode 23 is connected so that the voltage developed across resistor 25 is negative with respect to ground and diode 26 is connected so that the voltage developed across capacitor 28 is positive with respect to ground, the difference voltage which appears across the output of the coarse-frequency discriminator and is applied to the input of servo amplifier 34, will be negative as shown in the curve of Figure 2. Servo amplifier 34 responds to the application of negative voltage to its input to develop operating voltage for application to servo motor 35. The operating voltage has proper phase for operating motor 35 in the direction required for tuning plate circuits 17 to a higher frequency. Simultaneously, motor 35 operates through coupling 36 to adjust reactance 20. When the newly selected frequency is a higher frequency and reactance 20 is a capacitor, the capacitor will be positioned to provide less capacitance and, therefore, to increase the reactance of reactor 20. This increase in reactance causes an increase of voltage across capacitor 28 and a reduction in the differential voltage appearing across the output of the coarse-frequency discriminator. As the plate tuning circuits appreach resonance, the reactance of reactor 20 increases until the output voltage of the coarse-frequency discriminator approaches zero.

Figure 3:
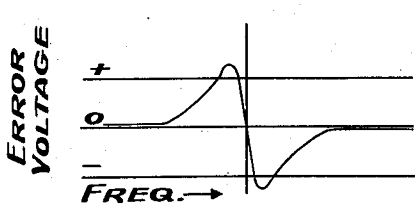
Figure 3 shows an error-voltage versus frequency curve of a fine-frequency discriminator.

When the plate tuning circuits are near resonance, the output voltage of the fine-frequency discriminator becomes larger than the output of the coarse-frequency discriminator so that control of the servo amplifier is transferred to the fine-frequency discriminator. As indicated in Figure 3, when the resonant frequencies of plate tuning circuits 17 are slightly higher than the frequency of the incoming signal, maximum negative voltage is developed by fine-frequency discriminator 29. In response to application of control voltage from the fine-frequency discriminator to the servo amplifier, servo motor 35 continues to operate until the plate tuning circuits are positioned exactly to the resonant frequency of the incoming signal. As shown in Figures 2 and 3, at resonance the output voltages of both the coarse-frequency discriminator and the fine-frequency discriminator becomes zero. Therefore, servo motor 35 ceases to operate when the plate tuning circuit 17 is tuned to the resonant frequency and the reactance of reactor 20 is equal to the resistance of resistor 19. If the input signal had been changed to a lower frequency, the discriminators would have developed a positive voltage for operating servo motor 35 in an opposite direction for tuning the plate tuning circuits to a lower frequency. Moreover, the reactance of reactor 20 would have been changed in an opposite direction to produce zero voltage at the output of the coarse-frequency discriminator when plate tuning circuits have been tuned to resonance.

The coarse-frequency discriminator of this invention may be applied to any radio equipment in which resonant circuits are to be tuned to a frequency of an incoming signal. For example, transmitter driver circuits 12 of Figure 1 may be tuned by a similar system shown in tuning the output stage.

Although this invention has been described with respect to a particular embodiment thereof, it is not to be so limited as changes and modifications may be made therein which are within the full intended scope of the invention as defined by the appended claim.

What is claimed is:

A servo system including a coarse-frequency discriminator, a fine-frequency discriminator, a servo amplifier, and a servo motor; a resonant circut to be tuned by said servo system, an input circuit to which is applied signal of different frequencies at different times, said coarse-frequency discriminator including a resistor and a variable reactor connected in series to said input circuit, discriminator circuit means connected to said resistor and variable reactor for developing a first control voltage that is the function of the difference between the voltage developed across said resistor and the voltage developed across said reactor, said fine-frequency discriminator being coupled to said input circuit and to said resonant circuit for deriving a second control voltage that is a function of the difference in phase between voltage that is applied to said input circuit and current in said resonant circuit, said discriminator circuit means and said fine-frequency discriminator being connected to said servo amplifier for applying said first and said second control voltages to said amplifier, both of said discriminators applying voltage of one polarity to said amplifier in response to application of signal having frequency higher than the resonant frequency of said resonant circuit and of opposite polarity in response to application of signal having lower frequency, said motor operating in response to the application of control voltage to said amplifier, the direction of operation being dependent upon the polarity of voltage applied to said amplifier, said plate tuning circuits and said variable reactor being mechanically connected to said motor, and said variable reactor being positioned for producing null control voltage in said discriminator circuit means in response to said resonant circuit being positioned for resonance at the frequency of the signal in said input circuit.

References Cited in the file of this patent

UNITED STATES PATENTS

| | | |
|---|---|---|
| 1,780,669 | Bruckel | Nov. 4, 1930 |
| 1,794,932 | Usselman | Mar. 3, 1931 |
| 1,794,933 | Usselman | Mar. 3, 1931 |
| 2,173,902 | Gerth | Sept. 26, 1939 |
| 2,193,843 | Robinson | Mar. 19, 1940 |
| 2,229,774 | Herringen | Jan. 28, 1941 |
| 2,320,996 | Alexanderssen | June 8, 1943 |
| 2,376,667 | Cunningham | May 22, 1945 |
| 2,415,469 | Webb | Feb. 11, 1947 |
| 2,423,229 | Crosby | July 1, 1947 |
| 2,425,922 | Crosby | Aug. 19, 1947 |
| 2,464,193 | Wild | Mar. 8, 1949 |
| 2,504,663 | Dome | Apr. 18, 1950 |
| 2,518,470 | Haviland | Aug. 15, 1950 |
| 2,798,150 | Tate | July 2, 1957 |

FOREIGN PATENTS

| | | |
|---|---|---|
| 134,903 | Australia | Oct. 26, 1949 |

OTHER REFERENCES

Serial No. 363,862, Dolle (A.P.C.), published May 25, 1943.